US012620944B2

(12) United States Patent
Tang et al.

(10) Patent No.: US 12,620,944 B2
(45) Date of Patent: May 5, 2026

(54) DIGITAL PRE-DISTORTION FOR FREQUENCY RANGE 2 SYSTEMS

(71) Applicant: Samsung Electronics Co., Ltd., Gyeonggi-do (KR)

(72) Inventors: Yanru Tang, San Diego, CA (US); Hou-Shin Chen, San Diego, CA (US); Sahana Sadagopan, San Diego, CA (US); Bhupinder Sachdev, San Diego, CA (US); Pranav Dayal, San Diego, CA (US)

(73) Assignee: Samsung Electronics Co., Ltd (KR)

( * ) Notice: Subject to any disclaimer, the term of this patent is extended or adjusted under 35 U.S.C. 154(b) by 488 days.

(21) Appl. No.: 18/335,583

(22) Filed: Jun. 15, 2023

(65) Prior Publication Data

US 2024/0283411 A1 Aug. 22, 2024

Related U.S. Application Data

(60) Provisional application No. 63/446,127, filed on Feb. 16, 2023.

(51) Int. Cl.
*H03F 1/32* (2006.01)
*H04L 27/36* (2006.01)
*H04W 52/08* (2009.01)

(52) U.S. Cl.
CPC ......... *H03F 1/3258* (2013.01); *H04L 27/367* (2013.01); *H04W 52/08* (2013.01); *H03F 2201/3233* (2013.01)

(58) Field of Classification Search
CPC ........... H03F 1/3258; H03F 2201/3233; H03F 3/189; H03F 2200/451; H03F 1/3241;
(Continued)

(56) References Cited

U.S. PATENT DOCUMENTS 8,331,484 B2 * 12/2012 Silverman ......... H04L 25/03343
375/296
11,082,021 B2 8/2021 Lin et al.
(Continued)

FOREIGN PATENT DOCUMENTS

CN 115720107 2/2023

OTHER PUBLICATIONS

Mohsen Mortazavi et al., "A Four-Way Series Doherty Digital Polar Transmitter at mm-Wave Frequencies", IEEE Journal of Solid-State Circuits, vol. 57, No. 3, Mar. 2022, pp. 803-817.
(Continued)

*Primary Examiner* — Hieu P Nguyen
(74) *Attorney, Agent, or Firm* — The Farrell Law Firm, P.C.

(57) ABSTRACT

Methods and devices are provided in which a processor of a user equipment (UE) combines loop-back signals from a plurality of antenna paths of the UE to generate a combined signal. The loop-back signals are based on a signal transmitted over the antenna paths. The processor determines power amplifier (PA) polynomials based on a comparison of the combined signal to the signal transmitted over the antenna paths. The processor generates a single look-up table (LUT) for the PA polynomials. The processor applies the single LUT to a transmitted signal of the UE to compensate for PA non-linearity.

20 Claims, 5 Drawing Sheets

(58) Field of Classification Search
CPC . H03F 1/3288; H03F 3/24; H03F 3/68; H04L 27/367; H04W 52/08; H04B 17/13; H04B 2001/0416; H04B 2001/0425
USPC ........................................................ 330/149
See application file for complete search history.

(56) References Cited

U.S. PATENT DOCUMENTS

| | | | |
|---|---|---|---|
| 11,165,514 | B2 | 11/2021 | Balteanu et al. |
| 11,431,357 | B2 | 8/2022 | Balteanu et al. |
| 2023/0009653 | A1 | 1/2023 | Vejlgaard et al. |

OTHER PUBLICATIONS

Sukwinder Singh et al., "Review of efficiency enhancement techniques and linearization techniques for power amplifier", International Journal of Circuit Theory and Applications 49(7) 2021, pp. 762-777.

* cited by examiner

402   Combine loop-back signals

404   Determine PA polynomials

406   Generate single LUT

408   Apply single LUT to signal

DIGITAL PRE-DISTORTION FOR FREQUENCY RANGE 2 SYSTEMS

CROSS-REFERENCE TO RELATED APPLICATION

This application claims the priority benefit under 35 U.S.C. § 119(c) of U.S. Provisional Application No. 63/446,127, filed on Feb. 16, 2023, the disclosure of which is incorporated by reference in its entirety as if fully set forth herein.

TECHNICAL FIELD

The disclosure generally relates to signal quality improvement using digital pre-distortion (DPD). More particularly, the subject matter disclosed herein relates to improvements to DPD for frequency range 2 (FR2) systems.

SUMMARY

Power amplifiers (PAs) of a wireless communication system are inherently nonlinear, which causes in-band distortion, resulting in degradation of system error vector magnitude (EVM) performance.

To solve this problem, DPD is used to compensate for PA non-linearity in order to improve signal quality. A look-up-table (LUT) approach may be adopted, in which amplitude-to-amplitude (AMAM) and amplitude-to-phase (AMPM) LUTs are constructed and applied to digital baseband signals to pre-compensate for PA non-linearity and improve system EVM performance.

One issue with the above approach is that, in FR2, each transmitter is equipped with multiple antennas. A DPD block should be designed considering PA characteristics of all of the antennas.

To overcome these issues, systems and methods are described herein for applying DPD to an FR2 system having multiple transmit (Tx) antennas, and generating an LUT by considering PA characteristics of all of the antennas.

The above approaches improve on previous methods because power DPD training improves performance for all power levels, and only requires a single LUT to reduce storage requirements and facilitate software implementation. Specifically, a single AMAM and AMPM LUT may be used to improve EVM performance for all power levels for FR2 systems.

In an embodiment, a method is provided in which a processor of a user equipment (UE) combines loop-back signals from a plurality of antenna paths of the UE to generate a combined signal. The loop-back signals are based on a signal transmitted over the antenna paths. The processor determines PA polynomials based on a comparison of the combined signal to the signal transmitted over the antenna paths. The processor generates a single LUT for the PA polynomials. The processor applies the single LUT to a transmitted signal of the UE to compensate for PA non-linearity.

In an embodiment, a UE is provided that includes a processor and a non-transitory computer readable storage medium storing instructions. When executed, the instructions cause the processor to combine loop-back signals from a plurality of antenna paths of the UE to generate a combined signal. The loop-back signals are based on a signal transmitted over the antenna paths. The instructions also cause the processor to determine PA polynomials based on a comparison of the combined signal to the signal transmitted over the antenna paths, and generate a single LUT for the PA polynomials. The instructions further causes the processor to apply the single LUT to a transmitted signal of the UE to compensate for PA non-linearity.

In an embodiment, a UE is provided that includes a plurality of antennas, each having a respective antenna path for transmission of a signal and reception of a respective loop-back signal. The UE also includes at least one PA and a processor. The processor is configured to combine loop-back signals from a plurality of antenna paths to generate a combined signal, and determine PA polynomials based on a comparison of the combined signal to the signal transmitted over the antenna paths. The processor is also configured to generate a single LUT for the PA polynomials, and apply the single LUT to a transmitted signal of the UE to compensate for non-linearity of the at least one PA.

BRIEF DESCRIPTION OF THE DRAWING

In the following section, the aspects of the subject matter disclosed herein will be described with reference to exemplary embodiments illustrated in the figures, in which.

DETAILED DESCRIPTION

Figure 1:
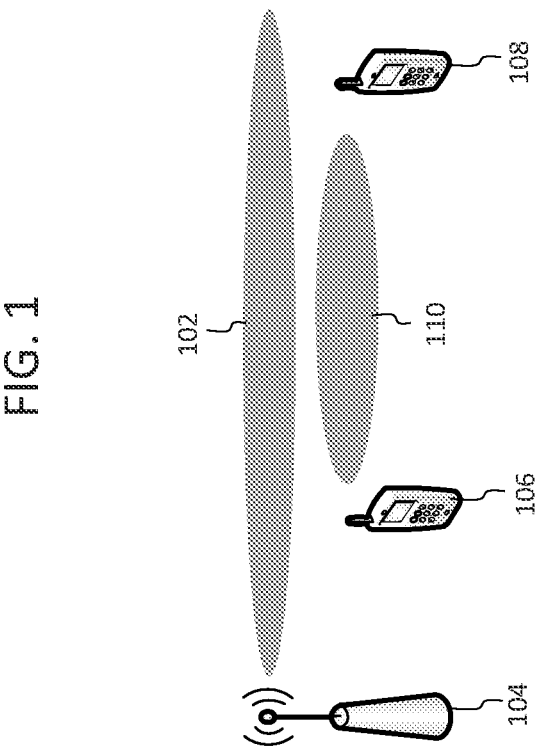
FIG. 1 is a diagram illustrating a communication system, according to an embodiment.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purposes only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

FIG. 1 is a diagram illustrating a communication system, according to an embodiment. In the architecture illustrated in FIG. 1, a control path 102 may enable the transmission of control information through a network established between a base station or a gNB 104, a first UE 106, and a second UE 108. A data path 110 may enable the transmission of data (and some control information) on a sidelink between the first UE 106 and the second UE 108. The control path 102 and the data path 110 may be on the same frequency or may be on different frequencies.

According to embodiments of the disclosure, PA polynomials may be estimated by comparing training signals and coherently combined receiver (Rx) signals of all antenna paths. For example, signals captured from all antenna paths may be combined based on power and phase information of each individual path. A normalized correlation between a Tx signal and a coherently combined Rx signal may be calculated to detect whether a captured signal is valid. When the normalized correlation is below a threshold, capture failure is detected, and recapture may be triggered automatically.

Dual power DPD training is provided in order to achieve improved DPD performance for all power levels. Specifically, data may be captured at a high power and a low power, high and low PA polynomials may be estimated, and a single LUT combining high and low PA polynomials may be generated.

A single LUT may be generated by using high/low PA polynomials for large/small power regions. A switching point between use of high/low PA polynomials may be determined by finding an intersection of estimated Rx AMs from two PA polynomials, or by using a fixed switching point calculated based on high and low power levels.

A single LUT may also be generated by using high PA polynomials to calculate all AMAM, while using high/low PA polynomials to calculate PM if AM is above/below a threshold. The threshold may be determined such that the normalized correlation of estimated PA response from high and low PA polynomials in a small signal region is relatively high (e.g., above 0.995).

Single power training may perform similarly to dual power training by fixing PM at a constant value for a small power region. Single power training may result in less training time and lower complexity when compared to dual power training.

Power control may be used to maintain the same nonlinear PA model in DPD training. For example, a digital gain before a DPD LUT may be added to compensate for a power difference that is introduced by a DPD LUT.

Close-loop-power-control (CLPC) may be performed to adjust amplitude gain (AMG) applied after DPD LUT (i.e., AMG2) and variable gain amplifier (VGA) gain after DPD LUT according to a power detector (PDET) at the PA output. Performing CLPC may make DPD robust against radio frequency integrated circuit (RFIC) gain loss due to an increase in temperature.

A goal of DPD training is to learn PA characteristics for a specific setting (e.g., when the PA is at a largest gain setting).

Figure 2:
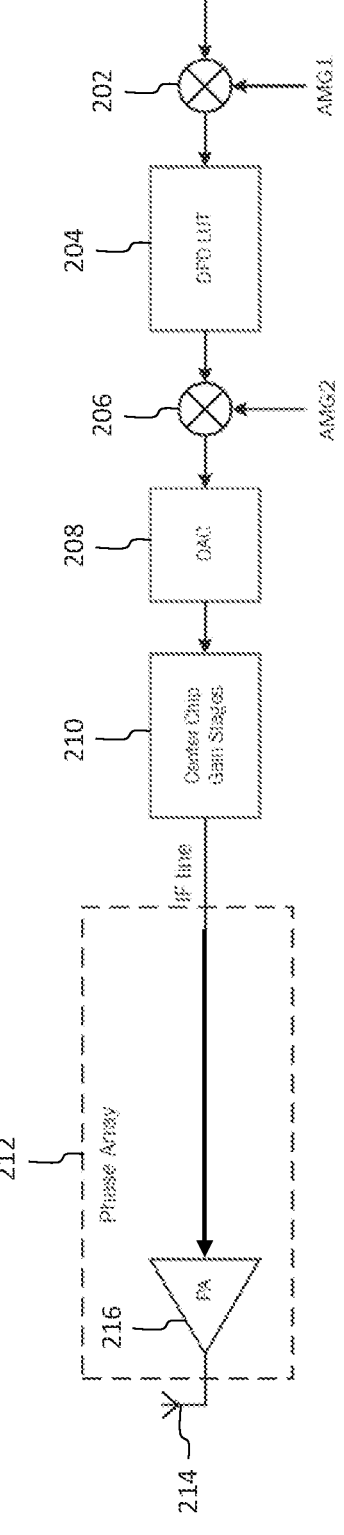
FIG. 2 is a diagram illustrating a signal path of a UE, according to an embodiment.

FIG. 2 is a diagram illustrating a signal path of a UE, according to an embodiment. A signal and an AMG applied before DPD LUT (i.e., nominal AMG1) are provided to a first multiplexer 202. DPD is applied to the multiplexed signal using calibrated AMAM and AMPM LUTs, at DPD block 204. An additional amplitude gain (i.e., AMG2) is applied to the signal after DPD output at a second multiplexer 206. The newly multiplexed signal is provided to a digital to analog converter (DAC) 208, center chip gain stages 210, and a phase array 212, before transmission from an antenna 214. The phase array 212 includes a PA 216.

As illustrated in FIG. 2, given that the PA is at some specific setting (e.g., a largest gain setting) and some predetermined gain settings for phase array and center chip, AMG2 may be searched until $1 \times N_{ant}$ PDETs report a predetermined target power level (e.g., 29 dBm or 27 dBm). $N_{ant}$ represents the number of antennas.

Applying the selected gain settings, a feedback receiver (FBRx) may be triggered for each antenna path to determine a loop back signal for each path. Given a captured signal for all paths, post processing may be performed to generate a combined signal, including integer and fractional delay estimation and coherent combining of all paths' signals. The above procedure may be separately performed for horizontal (H) and vertical (V) polarization.

A combined signal for H and V may be denoted by $r_H[n]$ and $r_V[n]$, respectively, as shown in Equation (1) below.

$$r_p[n] = \frac{648}{N_{ant}} \sum_{i=1}^{N_{ant}} \sqrt{\frac{P_{p,i}}{P_{p,1}}} e^{-j\varphi_{p,i}} \frac{\tilde{r}_{p,i}[n]}{\text{rms}(r_{p,i})}, \ p \in \{H, V\} \quad (1)$$

where $N_{ant}$ is the number of antenna paths (e.g., $N_{ant}=4$ or 5), $P_{p,i}$ is the RF PDET reading of the i-th loopback path at polarization p, $\tilde{r}_{p,i}[n]$ is the synchronized signal of the i-th path at polarization p after integer delay estimation and fractional delay interpolation, $\text{rms}(r_{p,i})$ is the root mean square power of the i-th path at polarization p, and $\varphi_{p,i}$ is the phase offset between transmitted signal and $r_{p,i}[n]$, for $p \in \{H, V\}$.

PA polynomials, denoted by $\hat{w}_H$ and $\hat{w}_V$, may be determined by comparing transmitted signals and combined signals for H and V, respectively, where $\hat{w}_p=(V^H V)^{-1} V^H r_p$, for $p \in \{H, V\}$. The vector of the combined signal for polarization $p \in \{H, V\}$ is shown in Equations (2) and (3) below.

$$r_p = \begin{bmatrix} r_p[1] \\ \vdots \\ r_p[N_{symb}] \end{bmatrix} \in C^{N_{symb} \times 1} \quad (2)$$

where $N_{symb}=2048$ denotes number of training samples.

$$V = \begin{bmatrix} v_1^H \\ \vdots \\ v_{N_{symb}}^H \end{bmatrix} \in C^{N_{symb} \times L} \quad (3)$$

$v_n^H = \begin{bmatrix} |x[n]|^0 x[n] & \dots & |x[n]|^{L-1} x[n] \end{bmatrix}$ (L: highest order of PA polynomials)

Given the estimated PA polynomials, a PA response for H and V may be estimated as $$f(x; \hat{w}_p) = \sum_{l=1}^{L} \hat{w}_{p,l} |x|^{l-1} x, \text{ for } p \in \{H, V\}.$$

AMAM and AMPM LUTs may be designed as an inverse of the learned PA response according to Equations (4), (5), and (6) below.

$$y_{p,max} = \max_{x \in [0, x_{max}]} |f(x; \hat{w}_p)| \text{ for } p \in \{H, V\} \quad (4)$$

$N_{lut}=32$ is denoted as the LUT size. The m-th point in AMAM and AMPM LUT, denoted by $\bar{r}_{p,m}$, $\overline{\emptyset}_{p,m}$ for polarization $p \in \{H, V\}$, may be determined according to Equations (5) and (6).

$$|f(\bar{r}_{p,m}; \hat{w}_p)| = \frac{y_{p,max}}{N_{lut} - 1} m, \ m = 0, \dots, N_{lut} - 1 \quad (5)$$

$$\overline{\emptyset}_{p,m} \stackrel{\Delta}{=} -\angle f(\bar{r}_{p,m}; \hat{w}_p), \ m = 1, \dots, N_{lut} - 1, \text{ and } \overline{\emptyset}_{p,0} = \overline{\emptyset}_{p,1} \quad (6)$$

An LUT from single power DPD training may show degradation in a low power region if the training is performed at relatively high power. To improve DPD performance for all power regions, dual power DPD training may be proposed. To avoid maintaining two LUTs corresponding to different powers, a single LUT that combines high and low power PA polynomials may be generated, as set forth below, reducing storage requirements and facilitating software implementation since switching LUTs is not required.

Single LUT generation combining two sets of PA polynomials requires an input of $\hat{w}_{p,high}$, $\hat{w}_{p,low} \in C^{L \times 1}$ at two DPD training power levels $P_{high}$, $P_{low}$. In a first step, $$\Delta g_{AMG2} = 10^{\frac{P_{high} - P_{low}}{20}}$$

may be calculated to account for a total gain difference from DPD output and PA input between two data captures. In a second step, $\hat{w}_{p,low}$ may be converted to $\hat{w}_{p,\Delta g_{AMG2}}$ such that both $\hat{w}_{p,high}$ and $\hat{w}_{p,\Delta g_{AMG2}}$ correspond to the same model (i.e., PA at G0 and total gain from DPD output to PA input at $g_{AMG2,high}$), as shown in Equation (7) below.

$$\hat{w}_{p,l,\Delta g_{AMG2}} = \hat{w}_{p,l,low} (\Delta g_{AMG2})^l, \ l = 1, \dots, L, \ p \in \{H, V\} \quad (7)$$

PA polynomials $\hat{w}_{p,\Delta g_{AMG2}}$ may be applied when $r \le r_{th}$, as shown in Equation (8) below.

$$f_{comb}(r) = f(r; \hat{w}_{p,\Delta g_{AMG2}}), \text{ for } r \le r_{th} = 0.8 * \frac{|x|_{max}}{\Delta g_{AMG2}} \quad (8)$$

Scaled PA polynomials may be applied corresponding to high power when $r > r_{th}$, as shown in Equation (9) below.

$$f_{comb}(r) = \hat{\alpha} f(r; \hat{w}_{p,high}), \text{ for } r > r_{th} \quad (9)$$

$\hat{\alpha}$ may be determined to best match $f(r; \hat{w}_{p,\Delta g_{AMG2}})$ and $f(r; \hat{w}_{p,high})$ for $r \leq r_{th}$, as shown in Equations (10) and (11) below.

$$\hat{\alpha} = \frac{y_{high}{}^H y_{low}}{y_{high}{}^H y_{high}} \qquad (10)$$

where:

$$y_{high} = \begin{bmatrix} f(r_1; \hat{w}_{p,high}) \\ \vdots \\ f(r_N; \hat{w}_{p,high}) \end{bmatrix}, \; y_{low} = \begin{bmatrix} f(r_1; \hat{w}_{p,\Delta g_{AMG2}}) \\ \vdots \\ f(r_N; \hat{w}_{p,\Delta g_{AMG2}}) \end{bmatrix}, \qquad (11)$$

$$r_1 < r_2 < \ldots < r_N \leq r_{th}$$

A single LUT may be generated using $f_{comb}(\cdot)$ according to Equations (4), (5), and (6), as shown in Equation (12) below.

$$f_{comb}(r) = \begin{cases} f(r; \hat{w}_{p,\Delta g_{AMG2}}) & \text{if } r \leq r_{th} \\ \alpha f(r; \hat{w}_{p,high}) & \text{if } r > r_{th} \end{cases} \qquad (12)$$

A benefit of dual power training is that a more accurate AMPM may be determined for a low power region, which improves EVM performance for all power regions at the cost of increased training time due to the dual data capture. To save training time, AMPM may be fixed at a constant value for small AM region using PA polynomials learned from a single data capture according to Equation (13) below.

$$\angle f(x; \hat{w}_p) = \angle f(r_{th}; \hat{w}_p), \text{ for } p \in \{H, V\}, x \leq r_{th} \qquad (13)$$

Such an approximation may result in a similar performance as that of dual power training.

Figure 3:
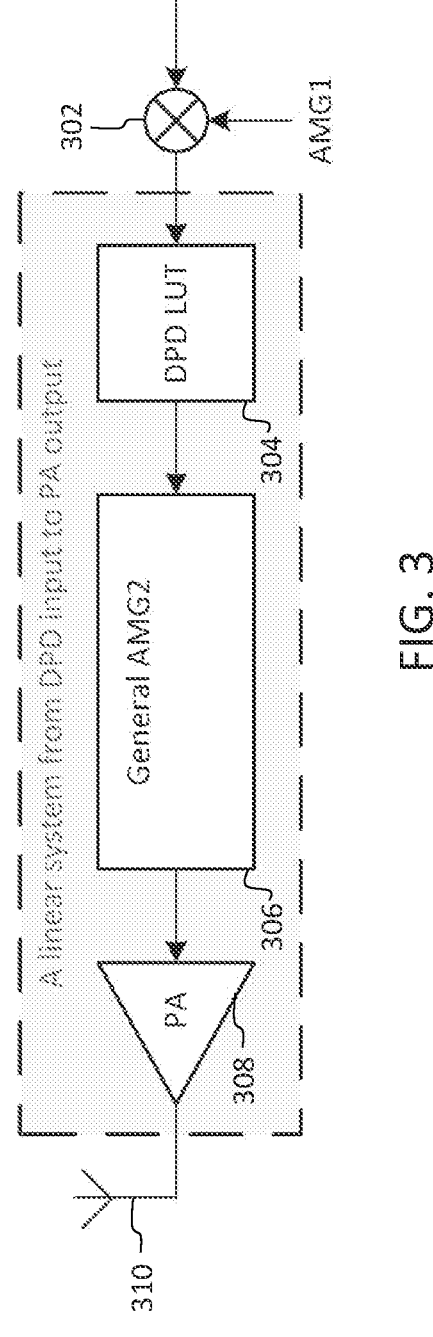
FIG. 3 is a diagram illustrating a linear system from DPD input to PA output, according to an embodiment.

FIG. 3 is a diagram illustrating a linear system from DPD input to PA output, according to an embodiment.

To achieve different power, only AMG1 may be adjusted and fed to a first multiplexer 302, because the learned LUT at a DPD block 304 is for a specific PA setting and a general AMG2 applied in training. General AMG2 306 refers to a total gain from output of the DPD block 304 to input to a PA 308, before antenna 310.

To maintain the same general AMG2 as used in training, AMG1 may be derived to achieve the target power (e.g., a high target power in case of dual power training). This may compensate for the gain loss due to an LUT application so that the DPD output power remains the same as that of the training data. The derived AMG1 is referred to as nominal AMG1. Given the nominal AMG1, a gain table may be constructed under the assumption that PA output power changes dB by dB according to AMG1.

In addition, a CLPC may be performed on an adjusted AMG2 and VGA gain after the DPD block 304 to maintain the non-linear PA model as the same as that in DPD training in case the RFIC gain drops due to an increase in temperature.

In case that PDET characteristics vary in single Tx and dual Tx modes, an AMG1 gain table may be adjusted to ensure that the general AMG2 remains the same as that used in training. For example, in a dual polarization Tx mode, if PDET reports 3 dB higher than in single polarization Tx mode given the same conditions, with no offset, the AMG2 in dual polarization mode will be 3 dB lower than that in single polarization mode (training mode). This mismatch may cause DPD performance degradation since the LUT is learned for the specific general AMG2.

As an approximation, one may offset the AMG1 gain table by $-3$ dB to increase the AMG2 in dual polarization mode by around 3 dB to match that in training mode. By using such an offset, the learned LUT shows good performance in both single polarization and dual polarization Tx modes.

Figure 4:
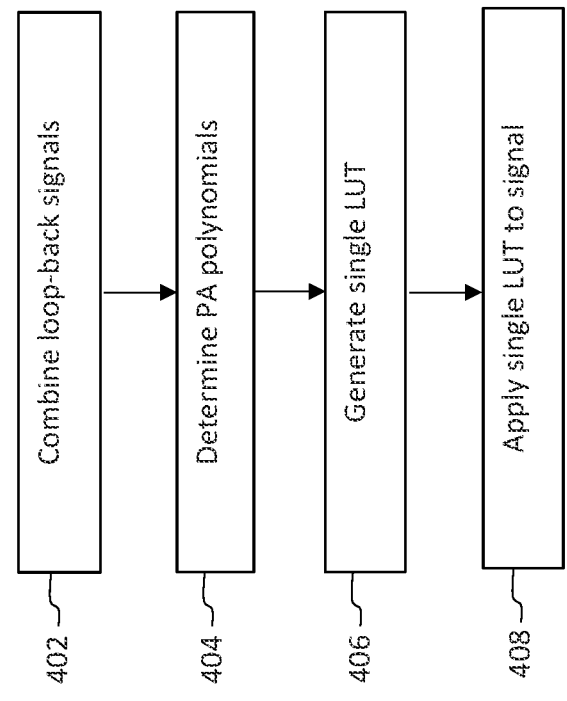
FIG. 4 is a flowchart illustrating a DPD training method, according to an embodiment.

FIG. 4 is a flowchart illustrating a DPD training method, according to an embodiment. At 402, a processor of a UE combines loop-back signals from antenna paths of the UE to generate a combined signal. The loop-back signals result from a signal transmitted over the same antenna paths. The loop-back signals are combined using power and phase information of each of the antenna paths.

At 404, the processor determines PA polynomials based on a comparison of the combined signal to the signal transmitted over the antenna paths. At 406, the processor generates a single LUT for the PA polynomials. The LUT may be an AMAM and AMPM LUT. At 408, the processor may apply the single LUT to a transmitted signal of the UE to compensate for PA non-linearity.

The loop-back signals may be captured at a first power and a second power that is lower than the first power. A first PA polynomial may be estimated from data received at the first power, and a second PA polynomial may be estimated from data received at the second power. The single LUT may be based on the first PA polynomial and the second PA polynomial.

The first PA polynomial may be used in a high power region and the second PA polynomial may be used in a low power region. A switching point between the high power region and the low power region may minimize AMAM difference between the first PA polynomial and the second PA polynomial. The switching point may be set as a constant.

The first PA polynomial may be used to calculate AMAM, the second PA polynomial may be used to calculated AMPM if AM is below an AM threshold, and the first PA polynomial may be used to calculate AMPM if the AM is greater than or equal to the AM threshold. The AM threshold may be set based on a normalized correlation of estimated PA response from high and low PA polynomials in a small region.

The single LUT may be generated by maintaining a constant AMPM in a small AM region from a single power data capture.

Digital gain may be controlled before applying the single LUT to compensate for gain difference introduced by the single LUT. CLPC may be applied to adjust digital gain (AMG2) and VGA after applying the LUT to compensate for gain loss due to an increase in temperature.

Captured FBRx data may occasionally be invalid. To detect this situation, a normalized correlation between the training signal and the combined signal may be calculated. If the correlation is below a threshold, capture failure is detected and auto data recapture may be performed.

A fixed switching point of high and low PA polynomials may be used, regardless of learned PA characteristics. However, in case of high saturation, the combined Rx AM may exhibit a monotonicity issue, which may lead to the LUT only using low power PA polynomials and significantly degrading DPD performance. To avoid such an issue, two approaches are described below for selecting a switching point depending on learned PA characteristics.

For example, if a learned high power PA model is very saturated, a relatively small switching point may be selected, which improves EVM performance.

A first approach is based on an intersection of two estimated PA models. $\hat{\alpha}$ may be estimated according to Equation (10) using all $$r \leq \frac{|x|_{max}}{\Delta g_{AMG2}}.$$

Switching point $r_{th}$ is determined as the AM intersection of f(r; $\hat{w}_{p,\Delta g_{ANG2}}$) and $\alpha$f(r; $\hat{w}_{p,high}$). This determination may have a relatively high complexity.

A second approach is based on normalized mean squared error (NMSE) of approximated AMAM. Since AMAM are almost linear in small AM region whether using high power or low power PA polynomials, low power region AMAM may be approximated using high power PA polynomial. Specifically, all AMAM may be derived using a high power PA polynomial, guaranteeing monotonicity of Rx AM.

For AMPM, it may be desirable to apply low/high power PA polynomial for small/large AM. The switching point of two PA polynomials is determined based on NMSE between the approximated AMAM and the AMAM from low PA polynomials in small signal region.

Minimizing NMSE may be equivalent to maximizing a normalized correlation between f(r; $\hat{w}_{p,\Delta g_{AMG2}}$) and f(r; $\hat{w}_{p,high}$) for $$r \leq \rho \frac{|x|_{max}}{\Delta g_{AMG2}}$$

for some scaling coefficient $\rho < 1$ (e.g., $\rho = 0.6$). Starting from $$\rho \frac{|x|_{max}}{\Delta g_{AMG2}},$$

a largest r is sought such that the normalized correlation is above some threshold (e.g., 0.995).

The second approach has a lower implementation complexity than the first approach.

Figure 5:
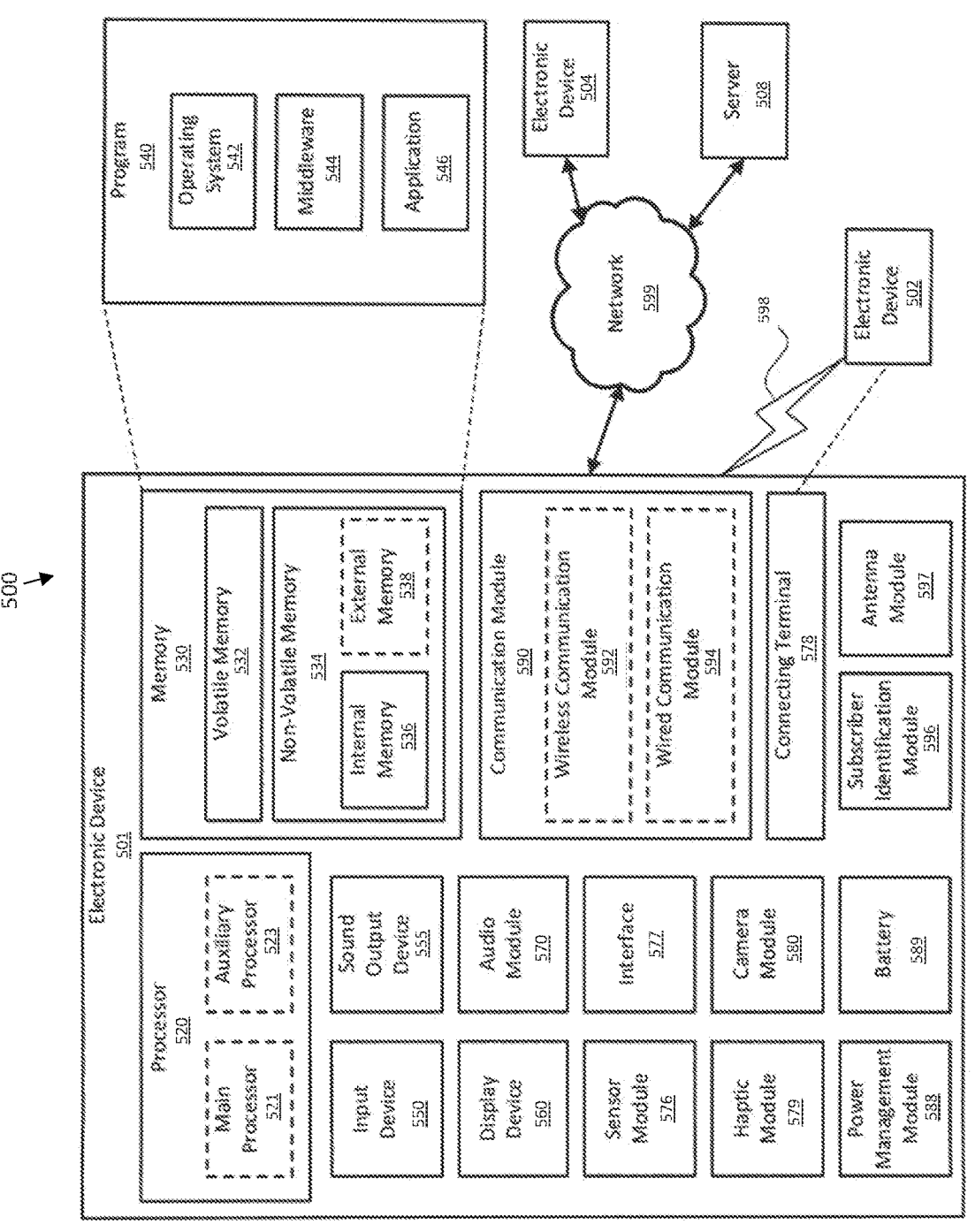
FIG. 5 is a block diagram of an electronic device in a network environment, according to an embodiment.

FIG. 5 is a block diagram of an electronic device in a network environment 500, according to an embodiment.

Referring to FIG. 5, an electronic device 501 in a network environment 500 may communicate with an electronic device 502 via a first network 598 (e.g., a short-range wireless communication network), or an electronic device 504 or a server 508 via a second network 599 (e.g., a long-range wireless communication network). The electronic device 501 may communicate with the electronic device 504 via the server 508. The electronic device 501 may include a processor 520, a memory 530, an input device 550, a sound output device 555, a display device 560, an audio module 570, a sensor module 576, an interface 577, a haptic module 579, a camera module 580, a power management module 588, a battery 589, a communication module 590, a subscriber identification module (SIM) card 596, or an antenna module 597. In one embodiment, at least one (e.g., the display device 560 or the camera module 580) of the components may be omitted from the electronic device 501, or one or more other components may be added to the electronic device 501. Some of the components may be implemented as a single integrated circuit (IC). For example, the sensor module 576 (e.g., a fingerprint sensor, an iris sensor, or an illuminance sensor) may be embedded in the display device 560 (e.g., a display).

The processor 520 may execute software (e.g., a program 540) to control at least one other component (e.g., a hardware or a software component) of the electronic device 501 coupled with the processor 520 and may perform various data processing or computations. Specifically, the processor 502 may execute instructions to perform steps described with respect to FIG. 4 above.

As at least part of the data processing or computations, the processor 520 may load a command or data received from another component (e.g., the sensor module 576 or the communication module 590) in volatile memory 532, process the command or the data stored in the volatile memory 532, and store resulting data in non-volatile memory 534. The processor 520 may include a main processor 521 (e.g., a central processing unit (CPU) or an application processor (AP)), and an auxiliary processor 523 (e.g., a graphics processing unit (GPU), an image signal processor (ISP), a sensor hub processor, or a communication processor (CP)) that is operable independently from, or in conjunction with, the main processor 521. Additionally or alternatively, the auxiliary processor 523 may be adapted to consume less power than the main processor 521, or execute a particular function. The auxiliary processor 523 may be implemented as being separate from, or a part of, the main processor 521.

The auxiliary processor 523 may control at least some of the functions or states related to at least one component (e.g., the display device 560, the sensor module 576, or the communication module 590) among the components of the electronic device 501, instead of the main processor 521 while the main processor 521 is in an inactive (e.g., sleep) state, or together with the main processor 521 while the main processor 521 is in an active state (e.g., executing an application). The auxiliary processor 523 (e.g., an image signal processor or a communication processor) may be implemented as part of another component (e.g., the camera module 580 or the communication module 590) functionally related to the auxiliary processor 523.

The memory 530 may store various data used by at least one component (e.g., the processor 520 or the sensor module 576) of the electronic device 501. The various data may include, for example, software (e.g., the program 540) and input data or output data for a command related thereto. The memory 530 may include the volatile memory 532 or the non-volatile memory 534. Non-volatile memory 534 may include internal memory 536 and/or external memory 538.

The program 540 may be stored in the memory 530 as software, and may include, for example, an operating system (OS) 542, middleware 544, or an application 546.

The input device 550 may receive a command or data to be used by another component (e.g., the processor 520) of the electronic device 501, from the outside (e.g., a user) of the electronic device 501. The input device 550 may include, for example, a microphone, a mouse, or a keyboard.

The sound output device 555 may output sound signals to the outside of the electronic device 501. The sound output device 555 may include, for example, a speaker or a receiver. The speaker may be used for general purposes, such as playing multimedia or recording, and the receiver may be used for receiving an incoming call. The receiver may be implemented as being separate from, or a part of, the speaker.

The display device 560 may visually provide information to the outside (e.g., a user) of the electronic device 501. The display device 560 may include, for example, a display, a hologram device, or a projector and control circuitry to control a corresponding one of the display, hologram device, and projector. The display device 560 may include touch circuitry adapted to detect a touch, or sensor circuitry (e.g., a pressure sensor) adapted to measure the intensity of force incurred by the touch.

The audio module 570 may convert a sound into an electrical signal and vice versa. The audio module 570 may obtain the sound via the input device 550 or output the sound via the sound output device 555 or a headphone of an external electronic device 502 directly (e.g., wired) or wirelessly coupled with the electronic device 501.

The sensor module 576 may detect an operational state (e.g., power or temperature) of the electronic device 501 or an environmental state (e.g., a state of a user) external to the electronic device 501, and then generate an electrical signal or data value corresponding to the detected state. The sensor module 576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 577 may support one or more specified protocols to be used for the electronic device 501 to be coupled with the external electronic device 502 directly (e.g., wired) or wirelessly. The interface 577 may include, for example, a high-definition multimedia interface (HDMI), a universal serial bus (USB) interface, a secure digital (SD) card interface, or an audio interface.

A connecting terminal 578 may include a connector via which the electronic device 501 may be physically connected with the external electronic device 502. The connecting terminal 578 may include, for example, an HDMI connector, a USB connector, an SD card connector, or an audio connector (e.g., a headphone connector).

The haptic module 579 may convert an electrical signal into a mechanical stimulus (e.g., a vibration or a movement) or an electrical stimulus which may be recognized by a user via tactile sensation or kinesthetic sensation. The haptic module 579 may include, for example, a motor, a piezoelectric element, or an electrical stimulator.

The camera module 580 may capture a still image or moving images. The camera module 580 may include one or more lenses, image sensors, image signal processors, or flashes. The power management module 588 may manage power supplied to the electronic device 501. The power management module 588 may be implemented as at least part of, for example, a power management integrated circuit (PMIC).

The battery 589 may supply power to at least one component of the electronic device 501. The battery 589 may include, for example, a primary cell which is not rechargeable, a secondary cell which is rechargeable, or a fuel cell.

The communication module 590 may support establishing a direct (e.g., wired) communication channel or a wireless communication channel between the electronic device 501 and the external electronic device (e.g., the electronic device 502, the electronic device 504, or the server 508) and performing communication via the established communication channel. The communication module 590 may include one or more communication processors that are operable independently from the processor 520 (e.g., the AP) and supports a direct (e.g., wired) communication or a wireless communication. The communication module 590 may include a wireless communication module 592 (e.g., a cellular communication module, a short-range wireless communication module, or a global navigation satellite system (GNSS) communication module) or a wired communication module 594 (e.g., a local area network (LAN) communication module or a power line communication (PLC) module). A corresponding one of these communication modules may communicate with the external electronic device via the first network 598 (e.g., a short-range communication network, such as Bluetooth™, wireless-fidelity (Wi-Fi) direct, or a standard of the Infrared Data Association (IrDA)) or the second network 599 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 592 may identify and authenticate the electronic device 501 in a communication network, such as the first network 598 or the second network 599, using subscriber information (e.g., international mobile subscriber identity (IMSI)) stored in the subscriber identification module 596.

The antenna module 597 may transmit or receive a signal or power to or from the outside (e.g., the external electronic device) of the electronic device 501. The antenna module 597 may include one or more antennas, and, therefrom, at least one antenna appropriate for a communication scheme used in the communication network, such as the first network 598 or the second network 599, may be selected, for example, by the communication module 590 (e.g., the wireless communication module 592). The signal or the power may then be transmitted or received between the communication module 590 and the external electronic device via the selected at least one antenna.

Commands or data may be transmitted or received between the electronic device 501 and the external electronic device 504 via the server 508 coupled with the second network 599. Each of the electronic devices 502 and 504 may be a device of a same type as, or a different type, from the electronic device 501. All or some of operations to be executed at the electronic device 501 may be executed at one or more of the external electronic devices 502, 504, or 508. For example, if the electronic device 501 should perform a function or a service automatically, or in response to a request from a user or another device, the electronic device 501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request and transfer an outcome of the performing to the electronic device 501. The electronic device 501 may provide the outcome, with or without further processing of the outcome, as at least part of a reply to the request. To that end, a cloud computing, distributed computing, or client-server computing technology may be used, for example.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A method comprising:
   combining, by a processor of a user equipment (UE), loop-back signals from a plurality of antenna paths of the UE to generate a combined signal, wherein the loop-back signals are based on a signal transmitted over the antenna paths;
   determining, by the processor, power amplifier (PA) polynomials based on a comparison of the combined signal to the signal transmitted over the antenna paths;
   generating, by the processor, a single look-up table (LUT) for the PA polynomials; and
   applying, by the processor, the single LUT to a transmitted signal of the UE to compensate for PA non-linearity.

2. The method of claim 1, wherein the loop-back signals are combined using power and phase information of each of the antenna paths.

3. The method of claim 1, wherein the LUT comprises an amplitude-amplitude (AMAM) and amplitude-phase (AMPM) LUT.

4. The method of claim 3, wherein:
   the loop-back signals are captured at a first power and a second power that is lower than the first power;
   determining the PA polynomials comprises estimating a first PA polynomial from data received at the first power, and a second PA polynomial from data received at the second power; and
   the single LUT is based on the first PA polynomial and the second PA polynomial.

5. The method of claim 4, wherein the first PA polynomial is used in a high power region and the second PA polynomial is used in a low power region.

6. The method of claim 5, wherein a switching point between the high power region and the low power region minimizes AMAM difference between the first PA polynomial and the second PA polynomial.

7. The method of claim 5, wherein the switching point between the high power region and the low power region is set as a constant.

8. The method of claim 4, wherein the first PA polynomial is used to calculate AMAM, the second PA polynomial is used to calculate AMPM if AM is below an AM threshold, and the first PA polynomial is used to calculate AMPM if the AM is greater than or equal to the AM threshold.

9. The method of claim 8, wherein the AM threshold is set based on a normalized correlation of estimated PA response from the first and second PA polynomials in a small region.

10. The method of claim 3, wherein generating the single LUT comprises maintaining a constant AMPM in a small AM region in case of a single power data capture.

11. The method of claim 1, further comprising:
   controlling digital gain before applying the single LUT to compensate for gain difference introduced by the single LUT.

12. The method of claim 11, further comprising:
   applying close loop power control (CLPC) to adjust digital gain and variable gain amplifier (VGA) gain after applying the LUT to compensate for gain loss due to temperature rise.

13. A user equipment (UE) comprising:
   a processor; and
   a non-transitory computer readable storage medium storing instructions that, when executed, cause the processor to:
      combine loop-back signals from a plurality of antenna paths of the UE to generate a combined signal, wherein the loop-back signals are based on a signal transmitted over the antenna paths;
      determine power amplifier (PA) polynomials based on a comparison of the combined signal to the signal transmitted over the antenna paths;

generate a single look-up table (LUT) for the PA polynomials; and apply the single LUT to a transmitted signal of the UE to compensate for PA non-linearity.

14. The UE of claim 13, wherein the LUT comprises an amplitude-amplitude (AMAM) and amplitude-phase (AMPM) LUT.

15. The UE of claim 14, wherein:

the loop-back signals are captured at a first power and a second power that is lower than the first power;

in determining the PA polynomials, the processor is further configured to estimate a first PA polynomial from data received at the first power, and a second PA polynomial from data received at the second power; and the single LUT is based on the first PA polynomial and the second PA polynomial.

16. The UE of claim 15, wherein:

the first PA polynomial is used in a high power region and the second PA polynomial is used in a low power region; and a switching point between the high power region and the low power region:

minimizes AMAM difference between the first PA polynomial and the second PA polynomial; or is set as a constant.

17. The UE of claim 15, wherein the first PA polynomial is used to calculate AMAM, the second PA polynomial is used to calculate AMPM if AM is below an AM threshold, and the first PA polynomial is used to calculate AMPM if the AM is greater than or equal to the AM threshold.

18. The UE of claim 14, wherein generating the single LUT comprises maintaining a constant AMPM in a small AM region in case of a single power data capture.

19. The method of claim 1, further comprising:

controlling digital gain before applying the single LUT to compensate for gain difference introduced by the single LUT.

20. A user equipment (UE) comprising:

a plurality of antennas, each having a respective antenna path for transmission of a signal and reception of a respective loop-back signal;

at least one power amplifier (PA); and a processor configured to:

combine the loop-back signals from the antenna paths to generate a combined signal;

determine PA polynomials based on a comparison of the combined signal to the signal transmitted over the antenna paths;

generate a single look-up table (LUT) for the PA polynomials; and apply the single LUT to a transmitted signal to compensate for non-linearity of the at least one PA.

* * * * *